United States Patent [19]

Page et al.

[11] Patent Number: 4,508,977
[45] Date of Patent: Apr. 2, 1985

[54] RE-PROGRAMMABLE PLA

[75] Inventors: David W. Page; LuVerne R. Peterson, both of San Diego, Calif.

[73] Assignee: Burroughs Corporation, Detroit, Mich.

[21] Appl. No.: 457,175

[22] Filed: Jan. 11, 1983

[51] Int. Cl.³ .................. H03K 19/177; H03K 19/094; H03K 23/24; H04Q 3/00
[52] U.S. Cl. .................................... 307/468; 364/716; 377/54; 377/64
[58] Field of Search ............... 307/465, 468, 469, 440, 307/445, 463; 364/716; 365/78, 103, 104; 377/54, 64, 69; 340/825.83, 825.87, 825.88, 825.90, 825.91, 825.93

[56] References Cited

U.S. PATENT DOCUMENTS

| | | | |
|---|---|---|---|
| 3,609,661 | 9/1971 | Hennes et al. | 340/825.91 |
| 3,987,286 | 10/1976 | Muelhdorf | 307/465 X |
| 4,024,352 | 5/1977 | Mukaemachi et al. | 340/825.91 X |
| 4,414,547 | 11/1983 | Knapp et al. | 307/465 X |
| 4,415,818 | 11/1983 | Ogawa et al. | 364/716 X |
| 4,422,072 | 12/1983 | Cavlan | 307/465 X |

OTHER PUBLICATIONS

Grice, "Electrically Programmable Logic Array", IBM Tech. Discl. Bull., vol. 22, No. 10, pp. 4621–4622; 3/1980.

Primary Examiner—Larry N. Anagnos
Attorney, Agent, or Firm—Charles J. Fassbender; J. Ronald Richbourg; Kevin R. Peterson

[57] ABSTRACT

This disclosure relates to a programmable logic array having an AND array disposed for receiving n input signals, an OR array providing k output signals on k output lines and m term lines coupling the AND and OR arrays together. New and improved AND and OR arrays are disclosed wherein the AND array includes n X m cells and each cell has first and second transistor means coupled in series between one of the term lines and a reference potential. Each cell includes a storage element that has an output terminal coupled to the control element of the first transistor means and one of the n input terminals is coupled to the control element of the second transistor means. The OR array includes m X k cells wherein each cell has third and fourth transistor means coupled in series between one of said output lines and a reference potential. Each of the OR array cells also includes a storage element having an output terminal coupled to the control element of the third transistor and one of the m term lines is coupled to the control element of the fourth transistor.

13 Claims, 4 Drawing Figures

RE-PROGRAMMABLE PLA

RELATED U.S. PATENT APPLICATIONS

U.S. Patent applications directly or indirectly related to the subject application are the following:

Ser. No. 457,176, filed Jan. 11, 1983 by Fazil I. Osman and entitled "A Dynamic Re-programmable PLA", and Ser. No. 457,177, filed Jan. 11, 1983 by David W. Page and entitled "A Dynamic Data Re-programmable PLA".

BACKGROUND OF THE INVENTION

This invention relates to programmable logic arrays (PLA's), and more particularly, to PLA's which are readily re-programmable.

In general, a PLA is a logic circuit which receives a plurality of digital input signals and generates a plurality of digital output signals wherein each of the digital output signals is a programmable sum-of-product combination of the input signals. In conventional PLA's, one circuit is provided for generating a plurality of terms which are the logical AND of selected input signals; and another circuit is provided to generate the output signals by selectively ORing the AND terms. A typical PLA may have a total of x input signals, generate a total of y AND terms from the input signals, and generate a total of z output signals by selectively ORing the y AND terms.

An article describing PLA's in more detail is "Field-PLA's Simplify Logic Designs", which was published in *Electronic Design* of Sept. 1, 1975, at pages 84–90. Another series of articles describing PLA's are "Field-programmable Arrays: Powerful Alternatives to Random Logic", *Electronics*, July 5,1979, pages 109–114; and "Field-programmable Logic, Part 2: Sequencers and Arrays Transform Truth Tables into Working Systems", *Electronics*, July 19, 1979, pages 132–139.

The general design of a PLA includes an AND array feeding into an OR array. The AND array accepts n inputs and divides them into data and data complement for each data line.

These data lines feed an array of terms m deep. Each term is the AND combination of data, data complement and don't care for each input (don't care is formed by ignoring data and data complement for a given input), hence a typical program may appear as:

term 1 = A∧B
term 2 = $\bar{A}$∧B
term m = $\bar{B}$

The term lines then feed into an OR array where each term line may be selectively OR'd into an output (the array is m X k where k is the number of outputs).

The prior art PLA's are typically designed for use in systems requiring permanent or semipermanent nonvolatile logic arrays. PROM's (programmable read only memories) are frequently used to implement logic arrays, which PROM's are usable only once after programming (i.e., the program cannot be changed once made). EPROM's (erasable PROM's) can be changed by the use of an ultraviolet light, which erasure requires several hours to complete. Also, another problem with EPROM's is that they are expensive.

EEPROM's (electrically erasable PROM's), which are even more expensive than EPROM's, require special power supplies. Furthermore, PROMS's are not configured as PLA's.

SUMMARY OF THE INVENTION

An advantage of the present invention resides in the provision of a unique design that is readily adaptable to standard MOS (metal oxide semiconductor) fabrication techniques.

Another advantage of this invention is the provision of a PLA design that is readily programmable or re-programmable as required.

A feature of this invention is a shift register disposed for storing the state of the PLA.

A programmable logic array is provided which has an AND array disposed for receiving n input signals, an OR array providing k output signals on k output lines and m term lines coupling the AND and OR arrays, wherein the array comprises new and improved random access AND and OR arrays. The AND array includes n×m cells wherein each cell has first and second transistor means coupled in series between one of the term lines and a reference potential. Each cell includes a data storage element that has an output teriminal coupled to the control element of the first transistor means and one of the n input terminals is coupled to the control element of the second transistor means. The OR array includes m×k cells wherein each cell has third and fourth transistor means coupled in series between one of said output lines and a reference potential. Each of the OR array cells also includes a data storage element having an output terminal coupled to the control element of the third transistor means and one of the m term lines is coupled to the control element of the fourth transistor means.

DETAILED DESCRIPTION OF THE INVENTION

Figure 1:
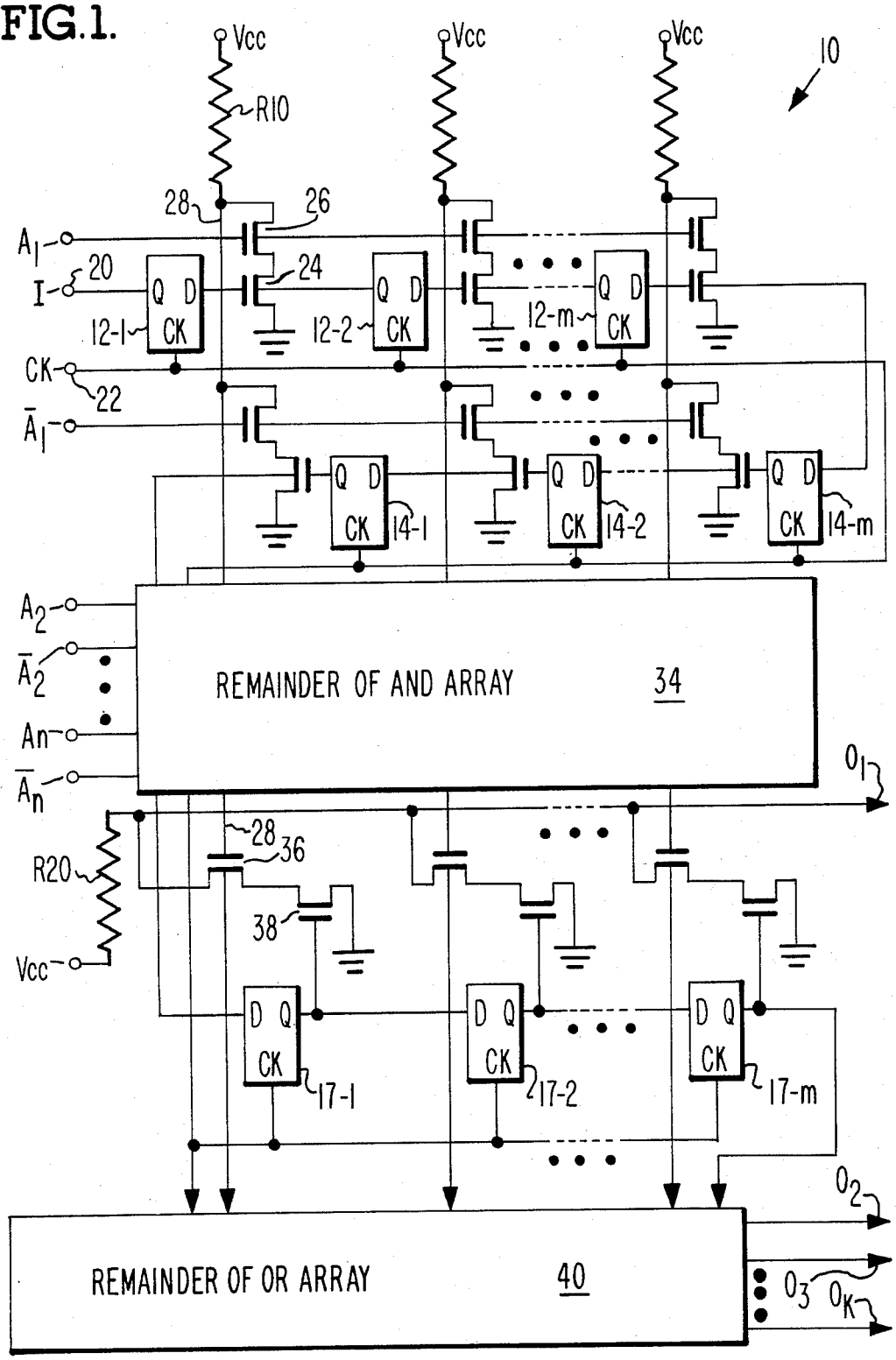
FIG. 1 is a logic-schematic diagram of the PLA of this invention.

Referring now to the drawings and in particular to FIG. 1, a programmable logic array (PLA) 10 in accordance with the present invention is illustrated in detail. A shift register including flip-flop register elements 12-1, 12-2, . . . 12-$m$, 14-1, 14-2, . . . 14-$m$, 17-1, 17-2, . . . 17-$m$ . . . are coupled together in a serial fashion. The data input of the flip-flop 12-1 is coupled to an input terminal 20, which terminal is disposed for serially receiving program data referred to herein as "I". The output terminal "Q" of the flip-flop 12-1 is coupled to the data input terminal "D" of the flip-flop 12-2, and so forth, in a similar serial fashion for the remaining flip-flops of the shift register. A clock signal is supplied on a terminal 22, which clock signal is coupled in parallel to the clock ("CK") input terminals of each of the flip-flops of the shift register. The operation of a serial shift register is well-known in the art, and will not be explained further hereafter.

The output of the flip-flop 12-1 is also coupled to the gate terminal of an MOS transistor 24. The drain terminal of the transistor 24 is coupled to ground potential and the source terminal thereof is coupled to the drain terminal of a second MOS transistor 26. The source terminal of the transistor-26 is coupled to a term line 28 which is also coupled to a power supply $V_{cc}$ through a resistor R10. This biases the term line to a high-level voltage.

The gate terminal of the transistor 26 is coupled to an address line $A_1$. The flip-flop 12-1 and the transistors 24 and 26 form a single cell of the AND array of the PLA 10, which is made up of a multiplicity of such cells arranged in an array of $2n \times m$ cells. Block 34 represents numerous additional such cells as that described above organized in a similar fashion and having address lines $A_2$ through $A_n$ including the complements of these address lines ($\overline{A}_2$ through $\overline{A}_n$).

The term line 28 is also coupled to the gate terminal of a transistor 36, and the source terminal of this transistor is coupled to output line $O_1$. The output line $O_1$ is biased at a high-level voltage by means of the $V_{cc}$ voltage supply through a resistor R20. The drain terminal of the transistor 36 is coupled to the source terminal of a transistor 38 and the drain terminal of this transistor is coupled to ground potential. The gate terminal of the transistor 38 is coupled to the output terminal of the flip-flop 17-1.

The flip-flop 17-1 and the transistors 36 and 38 form a single cell of the OR array of the PLA 10, which OR array is arranged in an array of $k \times m$ cells. Block 40 represents numerous additional such cells organized in a similar fashion, and having output lines $O_2$ through $O_k$.

The above-described PLA is programmed by serially loading data into the shift register on the terminal 20 ("I"). That is, the input data "I" is supplied (one bit at a time) on the terminal 20 while a clock signal ("CK") is supplied on the terminal 22.

Assume that the output of the flip-flop 12-1 is at a high level, and the transistor 24 is turned on. The terms high and low level are used in a conventional manner; and in one embodiment a high level is equal to approximately five volts while a low level is equal to approximately zero volts. When transistor 26 is turned on by a high level signal on the line $A_1$, the term line 28 is pulled down to ground potential, which potential is impressed upon the gate terminal of the transistor 36 thereby rendering transistor 38 ineffective. Thus, assuming no other term lines are at a high level, the output on the line $O_1$ in response to this single example would be a high level signal.

Figure 2:
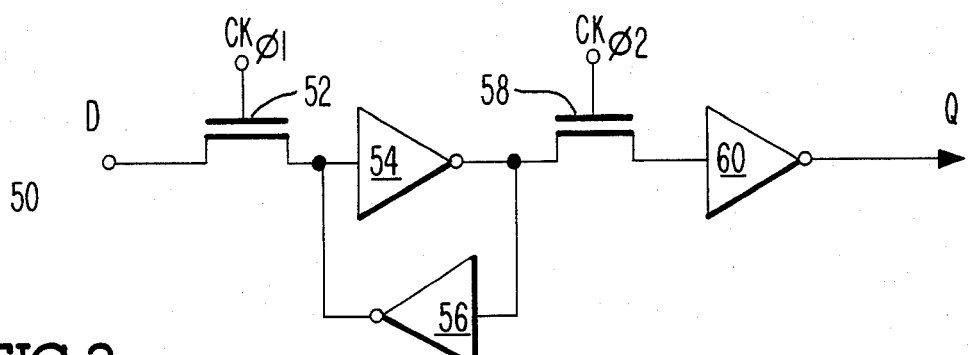
FIG. 2 is a schematic diagram of a register element used in this invention; and, FIGS. 3 and 4 show timing diagrams illustrating operation of the invention.

Referring now to FIG. 2, a typical flip-flop element is illustrated in detail. The data ("D") input terminal 50 is coupled to the source terminal of an MOS transistor 52 and the drain terminal thereof is coupled to the input terminal of an inverter 54. The gate terminal of the transistor 52 is coupled to the CK input terminal and is disposed for receiving phase 1 ($\phi_1$) of the clock signal. A second inverter 56, which is scaled smaller than the inverter 54, is coupled in a reverse parallel arrangement with the inverter 54 so as to form a latch. The output of the inverter 54 is also coupled to the drain terminal of a second MOS transistor 58, and the source terminal thereof is coupled to the input of yet another inverter 60. The gate terminal of the transistor 58 is coupled to phase 2 ($\phi_2$) of the clock signal. The output terminal of the inverter 60 is coupled to the flip-flop output terminal Q.

Figure 3:
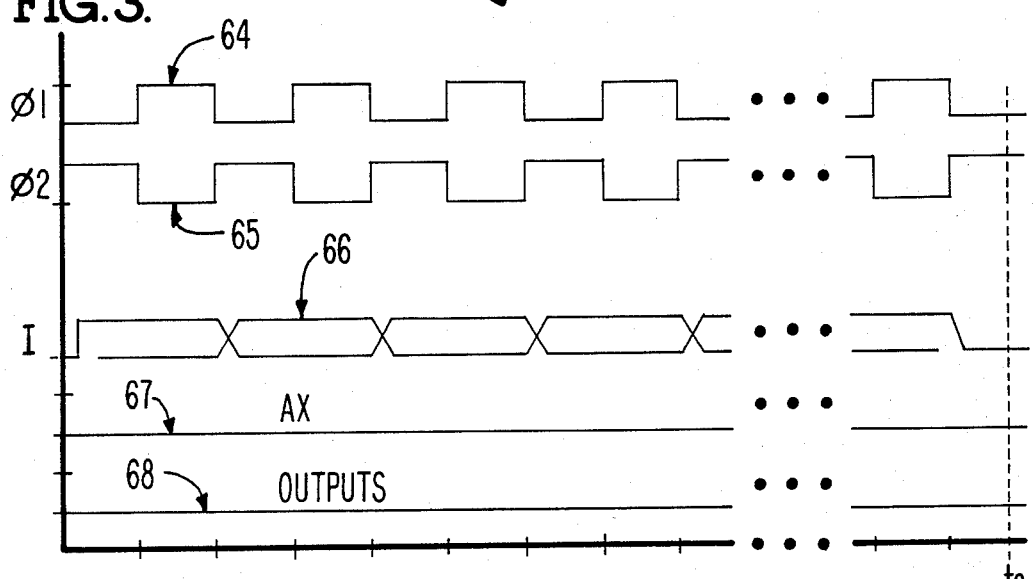

Before describing further the operation of the flip-flop circuit shown in FIG. 2, reference is made to the timing diagram of FIG. 3 wherein the operation of loading the PLA shift register is shown. Waveforms 64 and 65 illustrate phases 1 and 2, respectively, of the clock signal. Note that $\phi_2$ is the complement of $\phi_1$. Waveform 66 depicts the input data "I" which is to be stored in the PLA shift register. Waveform 67 illustrates the fact that all address lines are to be held at a low level during the programming operation, and waveform 68 shows the outputs at a low level during this operation. Time $t_e$ represents the end of the program mode of operation. Note that $\phi_1$ remains low and $\phi_2$ remains high after $t_e$.

Referring again to the flip-flop shown in FIG. 2, a high-level signal appearing on terminal 50 is transferred by the transistor 52 in response to the $\phi_1$ clock signal to the input of the inverter 54 where it is inverted to a low-level signal. This low-level signal is transferred by the transistor 58 in response to the $\phi_2$ clock signal to the input of the inverter 60 where it is inverted to a high-level signal at the output terminal Q. When the $\phi_1$ signal is held low and the $\phi_2$ signal is held high, the flip-flop will retain the last state. In other words, the circuit will store a high or low-level signal programmed therein since the input terminal 50 is isolated by the transistor 52 being turned off, and the output of the inverter 54 is coupled to the input of the inverter 60 by the transistor 58 being turned on.

Figure 4:
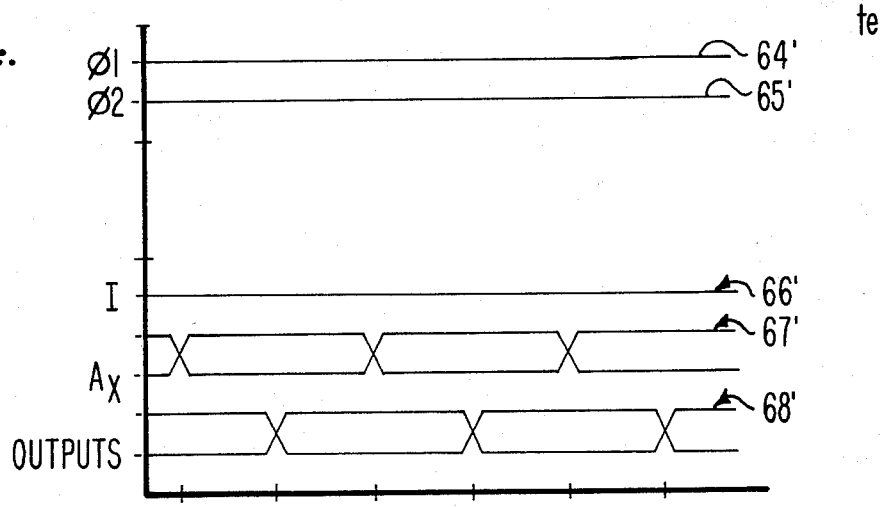

Referring now to FIG. 4, a timing diagram of the operation of the PLA is briefly summarized. Similar reference numerals with a prime are used in FIG. 4 to represent the same waveforms shown in FIG. 3 and described above. Note that $\phi_1$ (waveform 64') and I (waveform 66') are held at a lower level while $\phi_2$ is held at a high level. Note also that the address signals $A_x$ (waveform 67') and the output signals (waveform 68') will vary as a function of the address supplied to the PLA 10 and the outputs extracted from the PLA.

It may be appreciated from the description above that a re-programmable logic array has been described in detail. Thus, while the invention has been particularly shown and described with reference to only one embodiment, it will be understood by those skilled in the art that the foregoing and other changes in form and details may be made without departing from the spirit and scope of the appended claims.

What is claimed is:

1. In a programmable logic array having an AND array disposed for receiving n input signals, an OR array providing K output signals on k output lines and m term lines coupling said AND or OR arrays, wherein n, m, and k are integers greater than one, said array comprising:
   a. AND array having $n \times m$ cells wherein each cell comprises:
      (i) first and second transistor means coupled in series between one of said term lines and a reference potential, each of said transistor means having a control element;
      (ii) a first data storage element having an output terminal coupled to the control element of said first transistor means;
      (iii) one of said n input terminals being coupled to the control element of said second transistor means;
   b. OR array having $m \times k$ cells wherein each cell comprises:
      (i) third and fourth transistor means coupled in series between one of said output lines and a reference potential, each of said transistor means having a control element;
      (ii) a second data storage element having an output terminal coupled to the control element of said third transistor means;

(iii) one of said m term lines being coupled to the control element of said fourth transistor means; and c. a means for biasing said term lines and said output lines, and an input terminal means for writing data into each of said first and second data storage elements.

2. A programmable logic array as in claim 1 further characterized by said transistor means being MOS field effect transistors.

3. A programmable logic array as in claim 1 further characterized by said data storage elements being flip-flop circuits.

4. A programmable logic array as in claim 1 further characterized by said data storage elements in each of said cells being coupled together serially.

5. A programmable logic array as claim 1 or claim 3 further characterized by a clock signal being coupled in parallel to each of said data storage elements.

6. A re-programmable logic array comprising:
a. an AND array disposed for receiving n input signals and having n term lines wherein n and m are integers, said AND array having n×m cells each of each comprises:
   (i) first and second transistor means coupled in series between one of said term lines and a reference potential, each of said transistor means having a control element;
   (ii) a first data storage element having an output terminal coupled to the control element of said first transistor means;
   (iii) one of said n input terminals being coupled to the control element of said second transistor means;
b. an OR array providing K output lines and being coupled to said AND array by said term lines, wherein k is an integer, said OR array having m×k cells each of which comprises:
   (i) third and fourth transistor means coupled in series between one of said output lines and a reference potential, each of said transistor means having a control element;
   (ii) a second data storage element having an output terminal coupled to the control element of said third transistor means;
   (iii) one of said m term lines being coupled to the control element of said fourth transistor means; and
c. a means for biasing said term lines and said output lines, and an input terminal means for writing data into each of said first and second data storage elements.

7. A programmable logic array as in claim 6 further characterized by said data storage elements in each of said cells being coupled together serially.

8. A programmable logic array as in claim 6 further characterized by a clock signal being coupled in parallel to each of said data storage elements.

9. A re-programmable logic array comprising:
a. an AND array disposed for receiving n input signals on n rows of m cells per row;
b. an OR array providing k output lines on k rows of m cells per row, wherein n, m and k are integers greater than one;
c. m term lines coupling said cells of said AND array to said cells of said OR array;
d. each of said rows of cells of said AND and said OR arrays including:
   (i) shift register means of m data storage elements having an input terminal coupled to the first of said m data storage elements and an output terminal coupled to the output of the mth one of said m data storage elements, the input terminal of the first row shift register coupled to a program data input terminal and the output terminals of the first and each of the subsequent row shift registers being coupled to the input terminals of the next immediate following row shift register so as to form one continuous shift register through both said AND and said OR arrays; and
e. each of said data storage elements being operatively connected within its own individual cell to enable and disable the AND/OR function of the cell depending upon whether the data in the storage element is a one or zero respectively.

10. A re-programmable logic array as in claim 9 further characterized by each of said n×m cells in said AND array comprising first and second transistor means coupled in series between one of said term lines and a reference potential, each of said transistor means having a control element, one of said n input terminals being coupled to the control element of said first transistor means and an output terminal of one of said data storage elements being coupled to the control element of said second transistor means.

11. A re-programmable logic array as in claim 10 further characterized by each of said k×m cells in said OR array comprising third and fourth transistor means coupled in series between one of said output lines and a reference potential, each of said transistor means having a control element, one of said m term lines being coupled to the control element of said third transistor means and an output terminal of one of said data storage elements being coupled to the control element of said fourth transistor means.

12. A re-programmable logic array as in claim 9 further characterized by a clock signal being coupled in parallel to each of said data storage elements.

13. A re-programmable logic array as in claim 9 further characterized by each of said data storage elements being a flip-flop circuit.

* * * * *